(12) United States Patent
AbouKhousa et al.

(10) Patent No.: US 8,212,573 B2
(45) Date of Patent: Jul. 3, 2012

(54) HIGH FREQUENCY ANALYSIS OF A DEVICE UNDER TEST

(75) Inventors: Mohamed Ahmed AbouKhousa, Rolla, MO (US); Reza Zoughi, Wildwood, MO (US); Sergiy Kharkivskiy, Rolla, MO (US)

(73) Assignee: The Curators of the University of Missouri, Columbia, MO (US)

(*) Notice: Subject to any disclaimer, the term of this patent is extended or adjusted under 35 U.S.C. 154(b) by 718 days.

(21) Appl. No.: 12/354,545

(22) Filed: Jan. 15, 2009

(65) Prior Publication Data

US 2010/0176789 A1 Jul. 15, 2010

(51) Int. Cl.
*G01R 27/04* (2006.01)
(52) U.S. Cl. .................................................. 324/637
(58) Field of Classification Search .................. 324/637
See application file for complete search history.

(56) References Cited

U.S. PATENT DOCUMENTS

| | | | |
|---|---|---|---|
| 4,721,901 A | 1/1988 | Ashley | |
| 5,119,035 A | 6/1992 | Goy et al. | |
| 5,715,183 A | 2/1998 | Grace et al. | |
| 5,773,985 A * | 6/1998 | Bradley | 324/642 |
| 6,005,397 A | 12/1999 | Zoughi et al. | |
| 6,211,663 B1 | 4/2001 | Moulthrop et al. | |
| 6,456,092 B1 | 9/2002 | Arnold et al. | |
| 6,791,339 B2 | 9/2004 | Licini et al. | |
| 7,065,466 B2 * | 6/2006 | Clarke et al. | 702/122 |
| 7,113,879 B2 | 9/2006 | Hillstrom | |
| 7,148,702 B2 * | 12/2006 | Wong et al. | 324/650 |
| 7,235,982 B1 * | 6/2007 | Shoulders | 324/638 |
| 2004/0100276 A1 | 5/2004 | Fanton | |
| 2005/0212705 A1 | 9/2005 | Legay et al. | |
| 2007/0213947 A1 | 9/2007 | Jaklitsch | |
| 2010/0102829 A1 * | 4/2010 | Azarian | 324/651 |

OTHER PUBLICATIONS

Notification of Transmittal of the International Search Report and the Written Opinion of the International Searching Authority in International Application No. PCT/US 10/20735, dated Mar. 22, 2010, 12 pages.
R. Caldecott, "The generalized mulit-probe reflectometer and its application to automated transmission line measurements", IEEE Transaction of Antennas and Propagation, vol. Ap-21, No. 4, pp. 550-554, Jul. 1973.
K. Hoffmann et al., "A novel vector network analyzer," IEEE Transactions on Microwave Theory and Techniques, vol. 46, No. 12, pp. 2520-2523, Dec. 1998.
V. Zavodny et al., "7 State PTP for Vector Network Analyzer", 65th ARFTG Conference Digest, Jun. 17, 2005, 4 pages.
"Agilent AN 1287-1. Understanding the Fundamental Principles of Vector Network Analysis. Application Note.", Agilent Technologies, 14 pages. <http://cp.literature.agilent.com/litweb/pdf/5965-7707E.pdf>, Printed Aug. 2000. "Agilent AN 1287-2. Exploring the Architectures of Network Analyzers. Application Note.", Agilent Technologies, 12 pages <http://cp.literature.agilent.com/litweb/pdf/5965-7708E.pdf>, Printed Dec. 6, 2000.
Engen, Glenn, "The Six-Port Reflectometer: An Alternative Network Analyzer", IEEE Transactions on Microwave Theory and Techniques, vol. 25, Issue 12, Dec. 1977 p. 1075-1080.

* cited by examiner

*Primary Examiner* — Jeff Natalini
(74) *Attorney, Agent, or Firm* — Senniger Powers LLP

(57) ABSTRACT

Analyzing a device under test ("DUT") at higher frequencies. A phase shifter varies the phase of a standing wave on a transmission line coupled to the DUT. The standing wave magnitude is sampled at each of the phase shifts and one or more DUT characteristics are determined as a function of the sampled magnitudes and phase shifts. Further aspects include a related phase shifter comprising a waveguide having a plurality of sub-resonant slots formed therein and having active elements for loading the slots to control the phase shift applied to the signal.

20 Claims, 8 Drawing Sheets

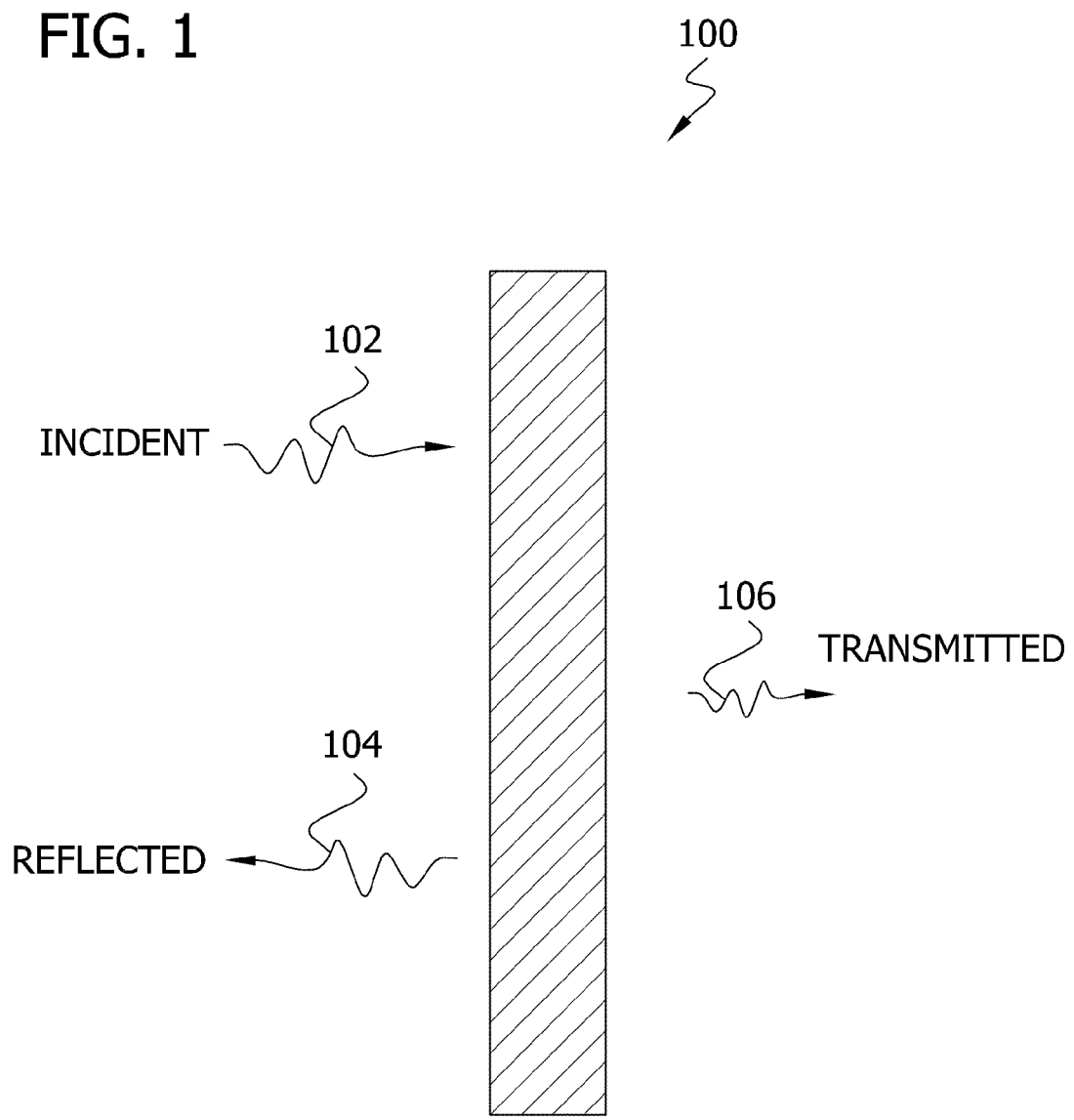

HIGH FREQUENCY ANALYSIS OF A DEVICE UNDER TEST

STATEMENT OF GOVERNMENT INTEREST

The U.S. Government has a paid-up license in this invention and the right in limited circumstances to require the patent owner to license others on reasonable terms as provided for by the terms of contract No. FA8103-07-C-0193 awarded by the U.S. Air Force.

BACKGROUND

Measurement of transmitted and reflected millimeter wave and microwave signals is useful for characterizing the properties of a device under test. Such properties, typically measured by a vector network analyzer, include the complex (i.e., magnitude and phase) reflection and transmission coefficients. Devices under test are, for example, high frequency circuit components, equipment that performs material characterization or nondestructive testing and evaluation, imaging systems, high-frequency transceivers, and ranging systems. Currently, taking measurements of transmitted and/or reflected signals at high frequencies involves expensive vector network analyzers, which employ phased-locked input sources and heterodyne detection processes to isolate or determine the frequencies to be measured. In addition to being prohibitively expensive, current vector network analyzers are considered bulky for applications where handheld, customized, and/or special purpose measurement modules are needed.

Accurate vector measurement of high frequency signals (i.e., their magnitude and phase) reflected back from and transmitted through a device under test ("DUT") helps characterize the electrical performance of the DUT. By way of analogy, FIG. 1 demonstrates these signals as a wave directed towards a slab 100, wherein the slab reflects and/or transmits an incident wave 102. FIG. 1 diagrammatically illustrates the incident wave 102 striking the slab, a reflected wave 104, and a transmitted wave 106. Based on measurements of the reflected and/or transmitted waves, the DUT can be characterized using known methods to determine its properties, such as its electrical impedance or the amount of signal distortion it causes to the supplied signal.

Among measurement devices known in the prior art for the measurement of the phase and magnitude of high frequency signals, FIGS. 2A-2D illustrate their operation. As shown in FIG. 2A, a vector network analyzer (VNA), generally indicated as 198, operably connects a stimulus source 214 (e.g., a built-in phased-locked oscillator) to a DUT 202. The source 214 supplies an incident signal 204 to the DUT 202. In a conventional test set-up, a plurality of directional coupling devices 210 separate the incident signal 204 from a reflected signal 206 and a transmitted signal 208. In turn, a receiver/detector 200 collects the signals 204, 206, 208 via the multiple directional coupling devices 210. In a typical vector network analyzer, such as VNA 198, the detector/receiver 200 comprises a tuned receiver, such as a super heterodyne receiver, allowing a high frequency input signal to be translated to a lower frequency through a process known in the art as down-conversion. The VNA 198 uses a reference signal (e.g., the incident signal 204 or a signal supplied from a second high-frequency source phase-locked to the primary stimulus source 214) in the down-converting process to mix with other signals. To down-mix the signals 204, 206 in this manner, VNA 198 must maintain signal separation and prevent the signals from interacting to form a combined or standing wave.

Other exemplary prior art techniques for measuring the phase and magnitude of high frequency signals are illustrated in FIGS. 2B-2D. As shown, these additional methods do not utilize heterodyne/tuned receivers. FIG. 2B illustrates a slotted-line method of measuring a complex reflection coefficient of a standing wave. This method utilizes a single detector probe 220 to gather measurements on a transmission line 222. However, the probe 220 must be physically moved along the length of the transmission line 222 to obtain the multiple measurements needed to accurately measure the complex reflection coefficient. Since the distance 224 between the DUT (not shown) and the detector 220 is a factor in the complex coefficient calculation, each change in position must be accurately measured and recorded contemporaneously with the corresponding transmission line measurement. This repeated repositioning and distance measuring makes automation burdensome, adding to the cost and complexity of implementing the slotted line method shown in FIG. 2B.

Referring now to FIG. 2C, a sampled line method requires at least three fixed detector probes 240 along a length of transmission line 242 to obtain the desired measurements unambiguously. Although this prior art method avoids the repositioning of a single detector probe (see FIG. 2B), probe interaction and non-identical probes introduce measurement errors that significantly affect measurement accuracy.

Another method known in the art for measuring incident and reflected signals is the so-called perturbation two-port ("PTP") method illustrated in FIG. 2D. The PTP method is based on using a combination of two-port perturbation (PTP) networks 260 inserted before the DUT 262 and a scalar network analyzer 264 (i.e., high quality reflectometer realized with a directional coupler). Multiple PTP networks 266, each representing different electrical characteristics, are required. Each PTP network changes/transforms the sought DUT reflection coefficient appearing at the input of the scalar network analyzer 264. When these multiple PTP networks are used along with a multi-step calibration routine, the sought after reflection coefficient can be determined (both magnitude and phase) after measuring the magnitude of the reflection coefficient seen at the input of the scalar network analyzer. Like the prior art VNA described above with respect to FIG. 2A, the PTP method demands signal separation. In the PTP method embodied in FIG. 2D, directional couplers (within the implementation of the scalar network analyzer) are again required to maintain separation between the incident and reflected signals. Furthermore, the PTP method requires that some of the used PTP networks have losses associated with them. Without signal separation and lossy PTP networks, the PTP method fails to work.

The conventional VNA 198 in FIG. 2A maintains signal separation of the incident, reflected, and transmitted signals, and employs one or more specialized tuned, heterodyne receivers to selectively isolate and analyze the signals collected, all of which increase the size, cost, and complexity of the device. Other prior art devices described above perform measurements without heterodyne procedures, but due to limitations inherent in their designs, measurement inaccuracies significantly undermine the useful operation of these devices. As noted above, it remained for the present inventors to discover a method and system of measuring the transmitted and reflected signals of a device under test without the cost and complexity of a tuned receiver, requiring directional coupling devices, or the introduction of significant inaccuracies in the measurement process.

SUMMARY

According to aspects of the invention, generating and manipulating the phase of a standing wave on a transmission line coupled to a device under test permits measuring the characteristics, e.g., phase and magnitude, of the transmitted and reflected wave signal associated with the device.

Briefly, a method for analyzing a device under test embodying aspects of the invention includes generating a standing wave on a transmission line coupled to the device under test, varying the phase of the standing wave with a phase shifter, and sampling the magnitude of the standing wave at each of a plurality of phase shifts. The method further includes determining at least one characteristic representative of the device under test as a function of the sampled magnitude of the standing wave and the plurality of phase shifts.

Another aspect of the invention is directed to a system for analyzing a device under test. The system includes a transmission line for coupling a signal source to the device under test. The signal source in turn provides a signal incident to the device under test. The signal incident to the device under test and a signal reflected from the device under test form a standing wave on the transmission line. The system also includes a phase shifter for varying the phase of the standing wave and a detector probe coupled to the transmission line for sampling a magnitude of the standing wave at each of a plurality of phase shift values. At least one characteristic representative of the device under test is determined as a function of the sampled magnitude of the standing wave on the transmission line and the plurality of phase shift values.

In another aspect, a vector network analyzer for determining phase and magnitude of signals at a frequency greater than very high frequency includes a phase shifter receiving and responsive to a phase control signal for applying a phase shift to a standing wave on a transmission line. The transmission line is coupled to a port of a device under test and a transmission line probe coupled to the transmission line samples a magnitude of the standing wave on the transmission line at each of a plurality of phase shift values. The probe is configured to generate a detector signal that corresponds to the sampled magnitude of the standing wave and a processor, receiving and responsive to the detector signal from the transmission line probe, determines at least one characteristic representative of the devices as a function of the sampled magnitude of the standing wave on the transmission line. In addition, the processor is configured for generating the phase shifter control signal.

A phase shifter coupled with a transmission line for applying a phase shift to a signal on the transmission line embodies further aspects of the invention. The phase shifter includes a waveguide having a plurality of slots formed therein. The slots each have dimensions that are sub-resonant with respect to a wavelength of the signal, which is at a frequency greater than very high frequency, and have an active element corresponding thereto for loading the slots to control the phase shift applied to the signal.

In accordance with aspects of the present invention, proper use of a combination of a transmission line, a detector, and a phase shifter eliminates the need for expensive heterodyne/tuned receiver detection schemes.

Other features will be in part apparent and in part pointed out hereinafter.

BRIEF DESCRIPTION OF THE DRAWINGS

FIG. 1 illustrates the transmission and reflection of high-frequency signals.

Corresponding reference characters indicate corresponding parts throughout the drawings.

DETAILED DESCRIPTION

Figure 2A:
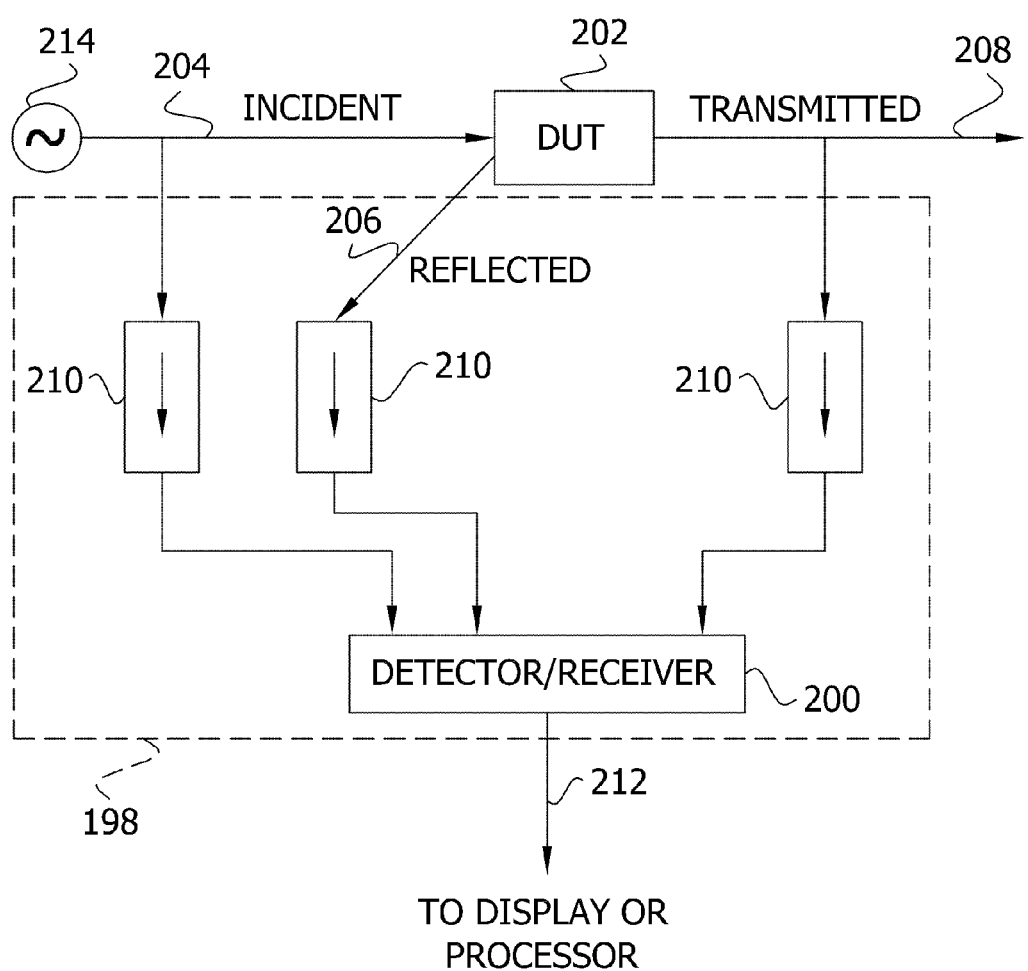
FIGS. 2A-2D are diagrams of prior art network analyzers, with multiple port connections to measure the incident, reflected, and transmitted high frequency signals.
Figure 2B:
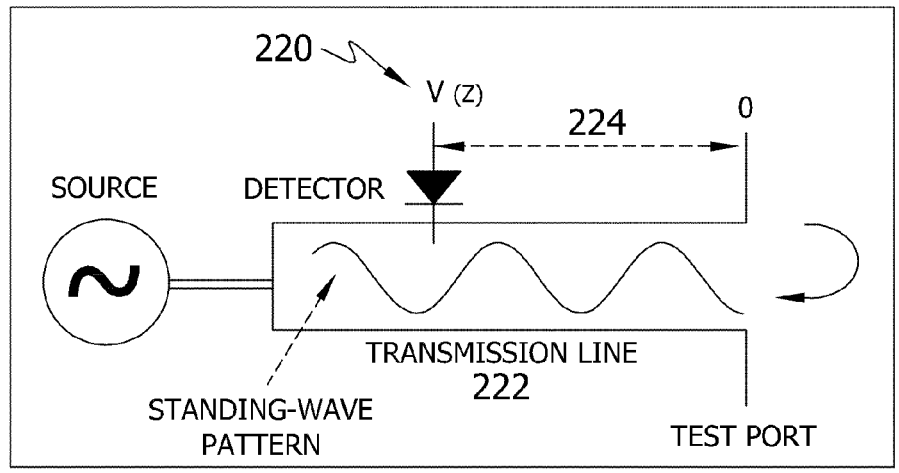
Figure 2C:
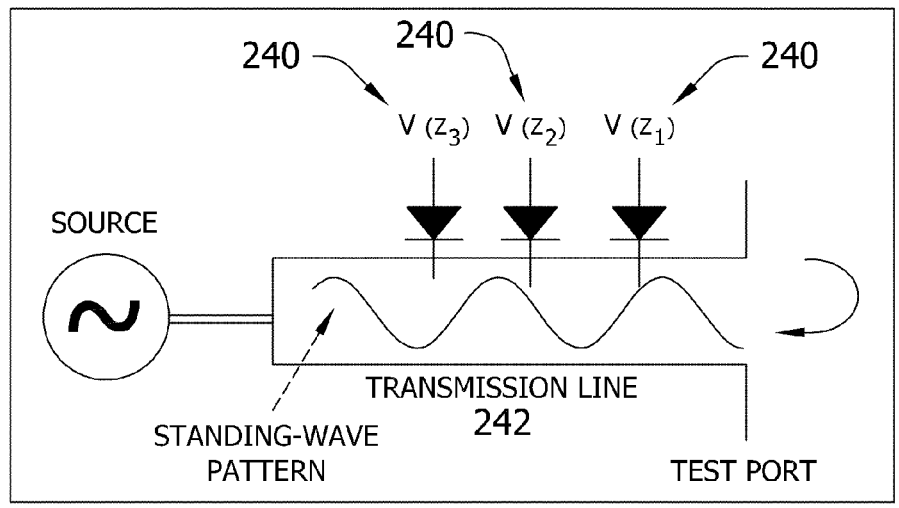
Figure 2D:
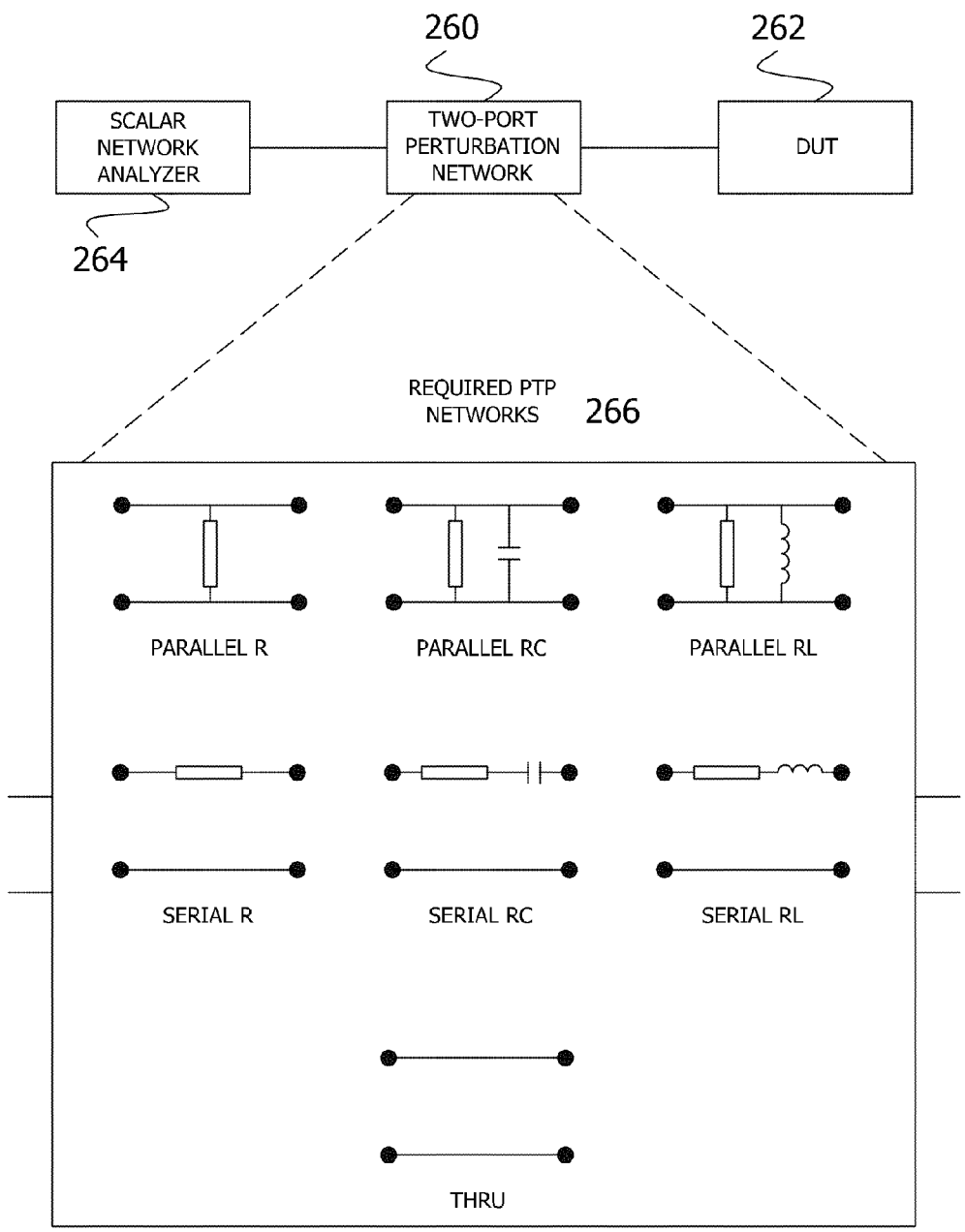
Figure 3:
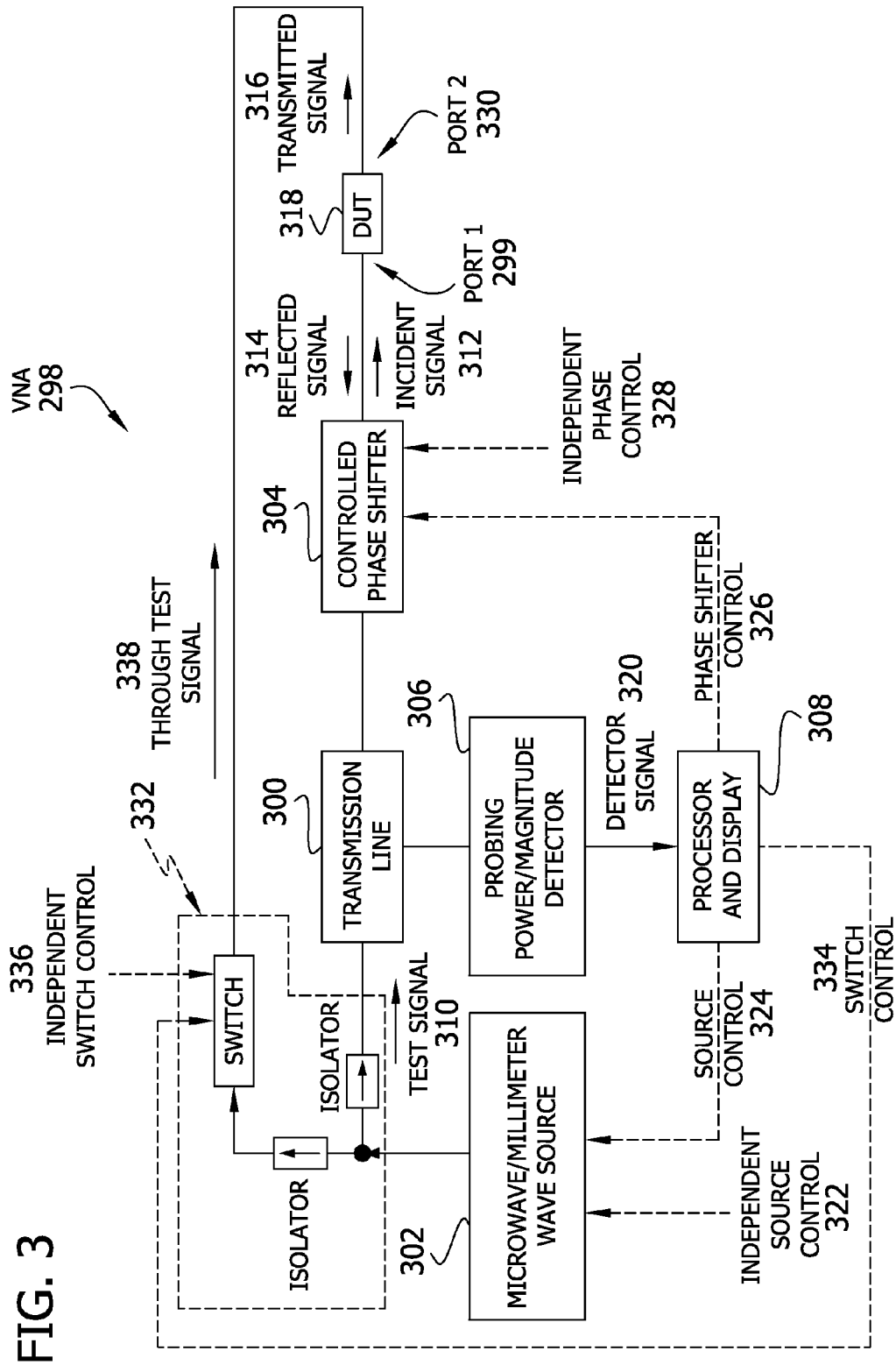
FIG. 3 illustrates a vector network analyzer according to an embodiment of the present invention.

Referring now to FIG. 3, a vector network analyzer (VNA) 298 embodying aspects of the present invention is shown in block diagram form. Advantageously, the VNA 298 is capable of obtaining measurements of signals at frequencies greater than very high frequency, including microwave and millimeter frequency signals, for analyzing performance characteristics of a device under test (DUT) 318. The DUT 318 can be, for example, a radar antenna, etc.

In one embodiment, VNA 298 comprises a transmission line 300 coupled to an input port 299 of the DUT 318. In this embodiment, the transmission line 300 is configured to transmit signals along its length to and from DUT 318, as shown in FIG. 3. The transmission line 300 can be, but is not limited to, a waveguide, coaxial line, or a micro-strip line. When an appropriate source signal 310 is supplied to transmission line 300, a resulting standing wave is formed along the length of the transmission line 300 as a function of the superposition of an incident signal 312 and a reflected signal 314 from the input port 299 of the DUT 318 propagating in opposite directions.

Referring further to the embodiment of FIG. 3, the VNA 298 comprises a transmission line 300 coupled with a controlled phase shifter 304, an embodiment of which is described below. The exemplary embodiment demonstrated in FIG. 3 shows a wave source 302 capable of generating signals greater than very high frequency. The source 302 is coupled to the transmission line 300 (see node 310 of FIG. 3). In the illustrated embodiment, this combination of elements allows for the generation of standing waves along a length of transmission line 300, due to the coherent addition of the signal applied to the input of the transmission line from the signal source 302 and the signal reflected from the port 299 of the DUT 318. According to aspects of the present invention, the controlled phase shifter 304 permits changes to the phase characteristics of the resulting standing wave.

Figure 4:
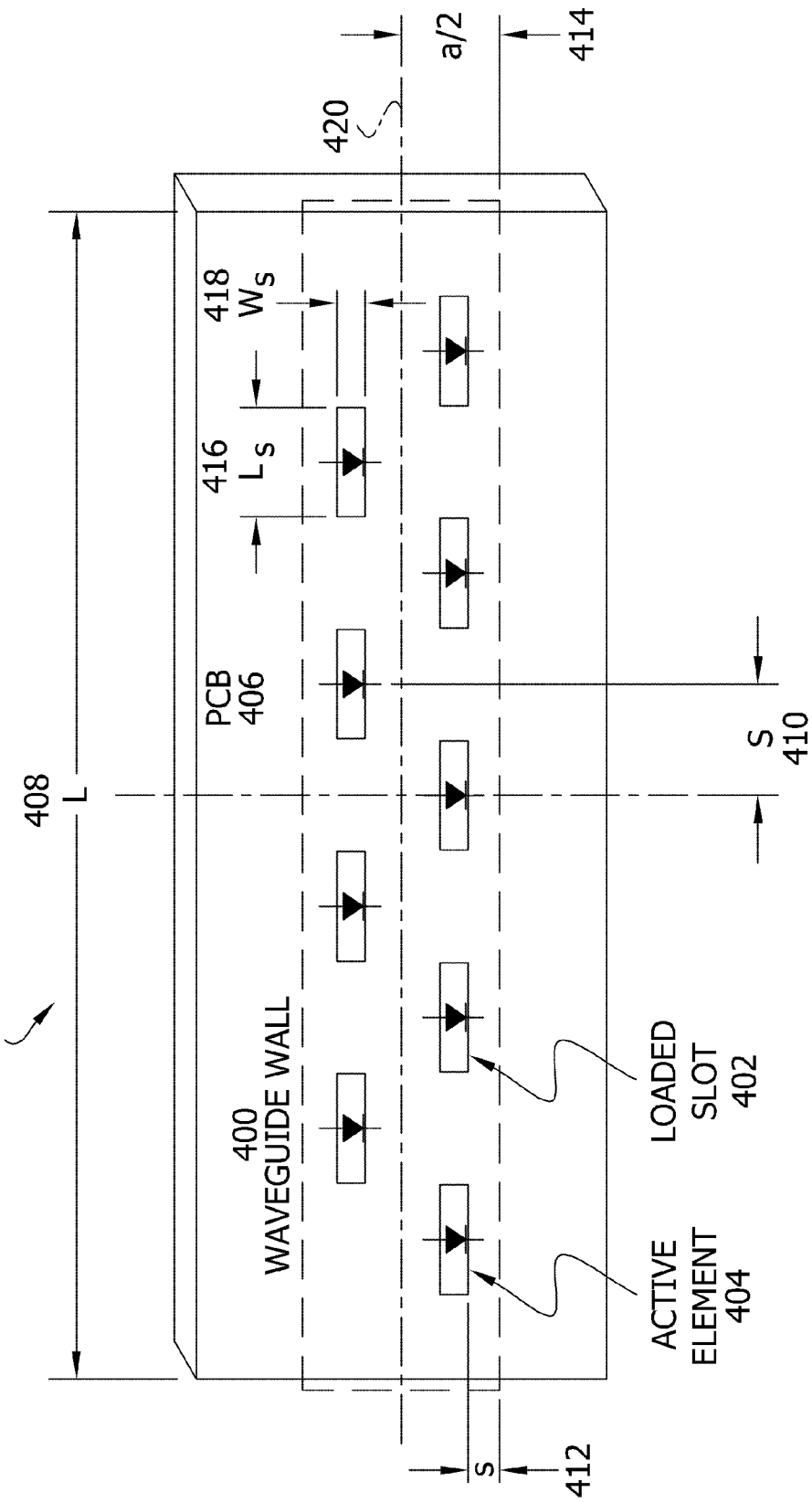
FIG. 4 illustrates a controlled phase shifter according to an embodiment of the present invention.

An embodiment of the phase shifter 304 of the present invention is shown in FIG. 4. In this embodiment, phase shifter 304 utilizes a plurality of sub-resonant slots 402 formed in a printed circuit board ("PCB") 406 used as a wall of a rectangular waveguide 400. According to aspects of the invention, loading the slots 402 with active elements 404 allows phase shifts to be applied to the standing wave generated along the length of transmission line 300. The slots 402 are configured to have a length ($L_s$) 416 and width ($W_s$) 418, such that the slots 402 are sub-resonant with respect to the wavelength of the signals being measured. In other words, the slots do not radiate efficiently. Additionally, the slots are configured to have a same-row slots center-to-center separation (S) 410 and a slot-to-waveguide edge separation (s) 412 over the total waveguide length (L) 408 and width (a) (see element 414).

In FIG. 4, the slots 402 are cut out into a printed circuit board (PCB) 406 forming the broad wall of the rectangular waveguide 400. In an alternative embodiment, the slots 402 are on the narrow wall. The slots 402 are formed in a longitudinal or transverse direction in the wall of the waveguide 400. FIG. 4 demonstrates slots 402 configured in a transverse direction. It is contemplated that the slots 402 can be placed or configured in any such manner that provides sufficient interaction with the current following on the walls of the waveguide 400. For example, if slots 402 are placed on or near the centerline 420 and rotated ninety degrees from the slot orientation demonstrated in FIG. 4, the slots 402 would be orthogonal to the current flow in the waveguide 400. The slots 402 can be formed in a variety of configurations to achieve sufficient phase shifts. However, slots 402 should be placed in a manner that minimally disturbs the standing wave shape and optimally affects the current flow on the wall of the waveguide 400. Additionally, slots 402 should have sub-resonant dimensions $L_s$ 416 and $W_s$ 418 such that the slots 402 do not cause signal reflection in and/or radiation from the waveguide 400. In the illustrated embodiment, the slots 402 are loaded with active elements such as PIN diodes 404, thereby allowing for electronic control of the applied phase shift.

In the example of FIG. 4, nine PIN diode loaded slots 402 are demonstrated, and turning each PIN diode 404 on and off using control direct current (dc) bias allows for 10 distinctive phase shifts to be applied to the signal on the transmission line 300. The phase shifter of FIG. 4 is provided by way of example and not limitation, and it should be understood that other slot configurations and active elements exist and are within the scope of the present invention.

The phase shifter can be calibrated using, for example, a high accuracy vector network analyzer to directly measure the scattering parameters of the phase shifter for use in the mathematical model described below. Otherwise, the phase shifter may be calibrated using a total of six known loads connected at the test port 299. Using the measurements of these six loads, the scattering parameters of the phase shifter can be determined by solving a set of six nonlinear equations.

Referring again to the embodiment illustrated in FIG. 3, at least one transmission line probe 306 is coupled to the transmission line 300 to sample the standing wave created on the transmission line 300 at a plurality of different phase shifts. The probe 306 is further configured to generate a detector signal 320 that corresponds to the sampled magnitude of the standing wave signal. In one embodiment, the probe 306 is an active element, such as a diode. A diode will produce a dc signal that is proportional to the magnitude of the sampled standing wave. Advantageously, varying the phase shift applied to the standing wave permits a plurality of samples to be taken without altering the placement of the probe or requiring multiple probes, as required in the prior art devices. Advantageously, eliminating the need to move the probe relative to the standing wave and eliminating the need for multiple probes prevents the resulting errors from being introduced into the sampled measurements. As a result, the generated information representative of a device under test is more accurate while minimizing VNA cost and complexity. In an alternative embodiment, a plurality of probes 306 coupled to the transmission line 300 to sample the standing wave created on the transmission line 300 at a plurality of different phase shifts, allowing for greater sampling accuracy over a wideband of frequencies.

FIG. 3 also illustrates a processor 308 configured to receive and respond to the detector signal 320. In response to the detector signal 320, processor 308 generates a source control signal 324, which it communicates to signal source 302 for controlling the incident signal injected into the transmission line 300 at 310. In addition, processor 308 also generates a phase shifter control signal 326 for controlling the amount of phase shift applied to the generated standing wave on the transmission line 300 by phase shifter 304. For instance, the phase shift control signal 326 turns on and off PIN diodes 404 for loading and unloading slots 402. The processor 308 optionally generates switch control signal 334 to turn the switch on and off. The processor 308 is also configured to generate information representative of the standing wave and the DUT 318 as a function of the sampled magnitude of the standing wave on transmission line 300 and the applied phase shift at each sampling.

In another embodiment, the processor 308 outputs the representative information to a display device or other suitable output device such as, but not limited to, memory storage, hard drive storage, or a printing device. In other embodiments of the present invention, the signal source 302 and/or phase shifter 304 are configured to communicate information to the processor 308 as well.

Referring further to FIG. 3, the processor 308 provides control signal 326 to the phase shifter 304 for setting the phase shift, provides control signal 324 for setting the operating parameters of the signal source 302 (e.g., frequency and magnitude level), provides switch control signal 334 to turn the switch on and off, and processes the resultant detector signal 320 at each applied phase shift. In one embodiment, the processor 308, operating in response to stored computer instructions, automatically shifts the phase and/or sweeps through frequencies and determines the representative information in real-time. In other embodiments of the present invention, the processor operates in response to manual operator control such as, but not limited to, keypad or keyboard entry, dial settings, or switches.

In an alternative embodiment, VNA 298 also includes a switched directional isolating element 332 coupled to a second port 330 of the DUT 318. In this embodiment, the switched directional isolating element 332 comprises a switch and an isolator as shown in FIG. 3. When an appropriate source signal 310 is supplied to the transmission line 300, a resulting standing wave is formed along the length of the transmission line 300 as a function of the superposition of incident signal 312 and reflected signal 314 from the input port 299 as well as a through test signal 338 passing through the DUT 318 via port 330 to port 299. As before, incident signal 312 and reflected signal 314 propagate in opposite directions. Likewise, incident signal 312 and through test signal 338 propagate in opposite directions. When the directional isolating element 332 is turned off in response to a switch control 334, a one-port (i.e., reflection) measurement can be conducted. On the other hand, when directional isolating element 332 is turned on, a two-port (transmission and reflection) measurement can be conducted. This combination of elements allows for the generation of standing waves along a length of transmission line 300, due to the coherent addition of the signal 310 applied to the input of the transmission line from the signal source 302 and the signal reflected 314 from the port 299 of the DUT 318, as well as the signal transmitted through the DUT 338 when the directional isolating element 332 is turned on. When the isolating element is turned on, the transmitted signal 316 is observed by the isolator 340. As with the signal source 302 and the phase shifter 304, directional isolating element 332 may also be configured to communicate information to the processor 308.

Figure 5:
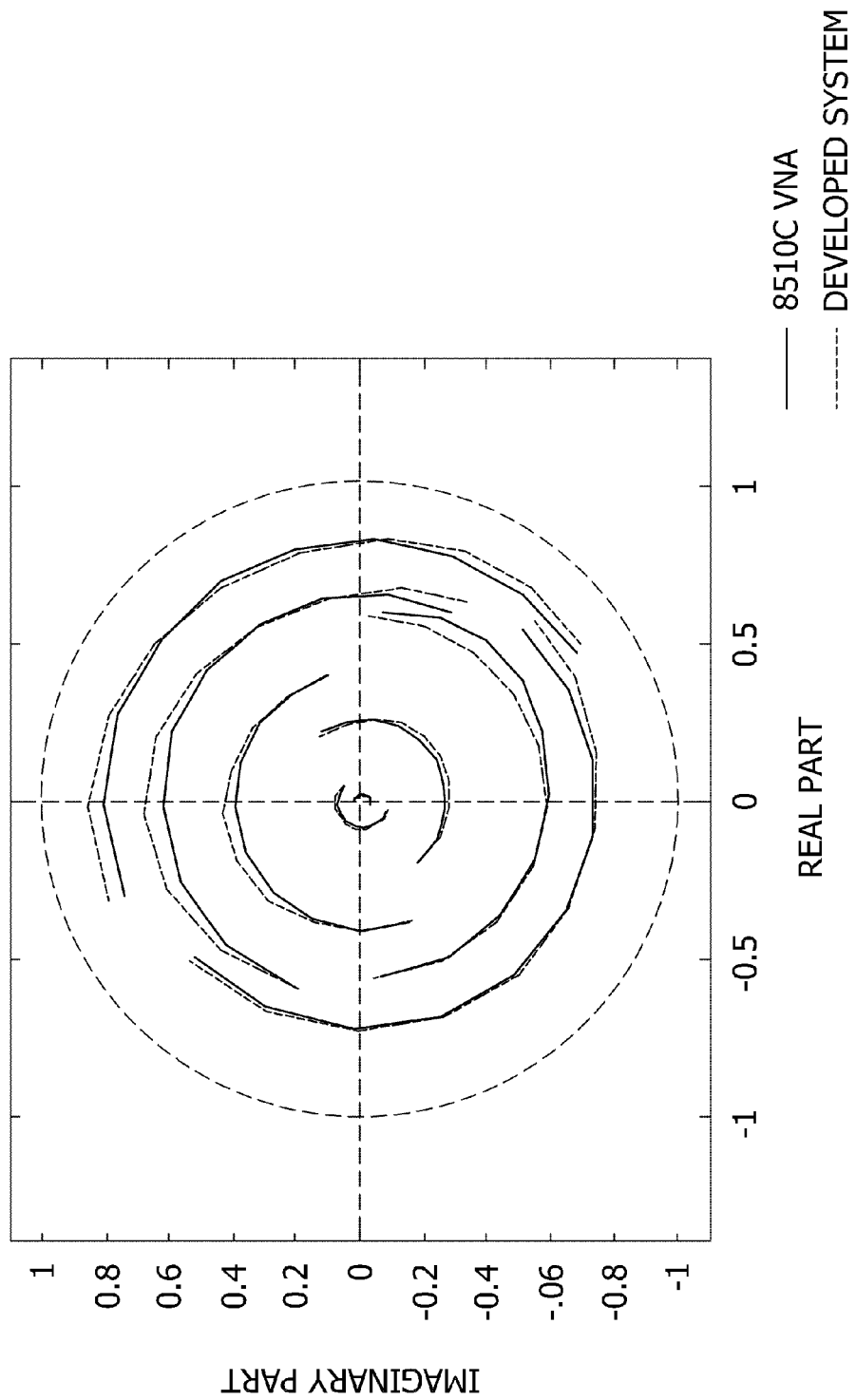
FIG. 5 and FIG. 6 illustrate exemplary measurements collected in accordance with an embodiment of the present invention as compared to measurements collected by a prior art vector network analyzer.
Figure 6:
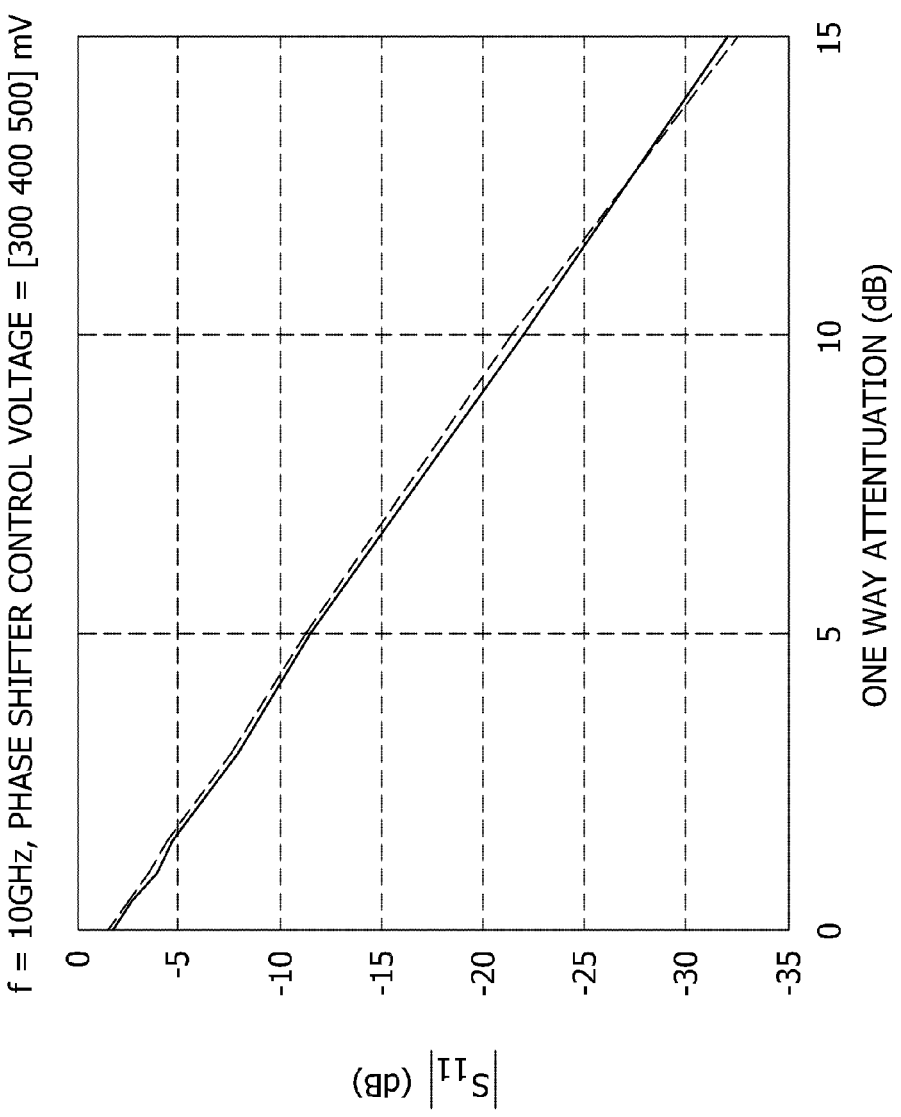

FIGS. 5 and 6 demonstrate exemplary results of an embodiment of the present invention as compared to the results of a prior art VNA (e.g., VNA 198).

The following mathematical models can be used to characterize the DUT 318 as a function of the applied phase shift and detector samples via probe 306 when the VNA 298 is configured to measure the reflected signal only (i.e. switch 332 is turned off):

$$V_d(\phi_m) = C|1 + \Gamma e^{-2j\beta L}|^2, m = 1, 2, \ldots M$$

$$\Gamma = S_{11,p} + \frac{S_{21,p} S_{12,p} S_{11}}{1 - S_{22,p} S_{11}}$$

$S_{ij,p}$, i=1, 2, j=1,2: Phase shifter scattering parameters as a function of the phase shift $\phi$ (as determined either through direct, independent VNA measurements, or solving six nonlinear equations using the measurement of six known loads).

$V_d(\phi_m)$: voltage sampled at detector
C: detector response
$\beta$: propagation factor
L: distance between detector and phase shifter on transmission line
$S_{11}$: input port voltage reflection coefficient (of the DUT)
M: total number of phase shift settings.

The M system of nonlinear equations can be solved (e.g., using the Newton-Gauss method) to find $S_{11}$. S-parameters are used by the present invention, as it is typically difficult to measure total current or voltage at higher frequencies.

Several experiments were conducted on an automated prototype VNA system using embodiments of the current invention to confirm its operation. The developed prototype VNA performance was verified against the commercially available HP8510C vector network analyzer (VNA). Referring to the experimental results illustrated in FIGS. 5 and 6, the prototype VNA (using a voltage controlled phase shifter) and the HP8510C were both used to measure the reflection coefficient of various DUTs at 10 GHz. The utilized DUTs represented a wide range of devices of various reflection properties. The magnitude of the reflection coefficient of the utilized DUT ranged from −2 dB to −30 dB and its phase ranged from 0 to 360 degrees. A DUT with these ranges advantageously spans the entire range of possible reflection measurements (as represented by the circle of unity radius in FIG. 5).

The prototype VNA was configured with an electronic phase shifter capable (of a type different from the embodiment illustrated in FIG. 4) of provided three phase shifts settings (M=3) in response to dc control voltage. The phase shifter was independently calibrated. FIG. 5 compares the experimental vector reflection measurements (in polar form) obtained using the prototype VNA and the HP8510C VNA for the same DUT. As demonstrated in the exemplary results in FIG. 5, both devices produced comparable results. FIG. 6 demonstrates the experimentally-measured magnitude of the reflection coefficient for the variable DUT using both the prototype VNA and the commercially available HP8510C VNA. It is important to observe the linearity of the response of the prototype VNA, embodying certain aspects of the present invention, and how well these experimental results compare to the much more expensive HP8510C VNA.

As shown FIGS. 5 and 6, the prototype VNA exemplary experimental measurements closely match those of the HP8510C VNA. These exemplary experimental results confirm the operation of the developed VNA and approach for vector reflection coefficient measurement with accuracy comparable to the commercial, expensive, and complex HP8510C VNA. It also highlights the desired linearity of the detection scheme.

In another preferred embodiment, the controlled phase shifter 304 is a commercially available phase shifter capable of providing discrete phase shifts to signals on a transmission line 300. The commercially available phase shifter must be capable of providing accurate, discrete phase shifts for the wave region to be measured while weakly perturbing the signals.

In yet another preferred embodiment, the controlled phase shifter 304 is a phase shifter embodying aspects of FIG. 4, where such a phase shifter permits measurements at higher frequencies.

In another preferred embodiment, the signal 310 can be externally supplied, with the signal source configured to receive control signals from the processor for controlling the characteristics of the supplied signal. In another embodiment, the signal source is configured for independent source control.

In operation, a method embodying aspects of the invention includes generating a standing wave on a transmission line 300 coupled to the device under test 318, varying the phase of the standing wave with a phase shifter 304, and sampling the magnitude of the standing wave at each of a plurality of phase shifts. Further, the method determines at least one characteristic representative of the device under test 318 as a function of the sampled magnitude of the standing wave and the plurality of phase shifts. Such characteristics include, but are not limited to, phase and magnitude of the reflected signal 314 or the transmitted signal 316, dielectric properties of the DUT 318, calculated as a function of the phase and magnitude of the reflected signal 314, and structural properties of the DUT 318.

In operation, a system embodying aspects of the invention analyzes a device under test 318. The system includes a transmission line 300 for coupling a signal source 302 to the device under test 318, wherein the signal source 302 provides a signal 310 incident to the device under test and wherein the signal 312 incident to the device under test 318 and a signal 314 reflected from the device under test 318 form a standing wave on the transmission line 300. The system is further comprised of a phase shifter 304 for varying the phase of the standing wave and a detector probe 306 coupled to the transmission line 300 for sampling a magnitude of the standing wave at each of a plurality of phase shift values. Thus, at least one characteristic representative of device under test 318 is determined as a function of the sampled magnitude of the standing wave on the transmission line 300 and the plurality of phase shift values.

In operation, a vector network analyzer 298 embodying aspects of the invention determines the phase and magnitude of signals at a frequency greater than very high frequency for a device under test 318. The vector network analyzer 298 includes a phase shifter 304 receiving and responsive to a phase control signal 326 for applying a phase shift to a standing wave on a transmission line 300, said transmission line 300 being coupled to a port 299 of the DUT 318, and a transmission line probe 306 coupled to the transmission line 300 for sampling a magnitude of the standing wave on the transmission line 300 at each of a plurality of phase shift values, said probe 306 being configured to generate a detector signal 320 that corresponds to the sampled magnitude of the standing wave. In this instance, the vector network analyzer 298 further comprises a processor 308 receiving and responsive to the detector signal 320 from the transmission line probe 306 for determining at least one characteristic representative of the DUT 318 as a function of the sampled magnitude of the standing wave on the transmission line 300, said processor being further configured for generating the phase shifter control signal.

In another embodiment, the present invention is a phase shifter coupled with a transmission line for applying a phase shift to a signal on the transmission line, said signal being at a frequency greater than very high frequency, said phase shifter comprising a waveguide having a plurality of slots formed therein, said slots each having dimensions that are sub-resonant with respect to a wavelength of the signal on the transmission line, and said slots each having an active element corresponding thereto for loading the slots to control the phase shift applied to the signal.

While specific embodiments are discussed, it should be understood that this is done for illustrative purposes only. A person skilled in the relevant art will recognize that other components and configurations can be used without parting from the spirit and scope of the invention.

The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention. Embodiments of the invention may be implemented with computer-executable instructions. The computer-executable instructions may be organized into one or more computer-executable components or modules. Aspects of the invention may be implemented with any number and organization of such components or modules. For example, aspects of the invention are not limited to the specific computer-executable instructions or the specific components or modules illustrated in the figures and described herein. Other embodiments of the invention may include different computer-executable instructions or components having more or less functionality than illustrated and described herein.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

Having described aspects of the invention in detail, it will be apparent that modifications and variations are possible without departing from the scope of aspects of the invention as defined in the appended claims. As various changes could be made in the above constructions, products, and methods without departing from the scope of aspects of the invention, it is intended that all matter contained in the above description and shown in the accompanying drawings shall be interpreted as illustrative and not in a limiting sense.

What is claimed is:

1. A method of analyzing a device under test comprising:
generating a standing wave on a transmission line coupled to the device under test, said standing wave comprising a coherent addition of a signal incident to the device under test and a signal reflected from the device under test, wherein a greater than very high frequency signal source supplies the signal incident to the device under test;
varying the phase of the standing wave with a phase shifter;
sampling the magnitude of the standing wave at each of a plurality of phase shifts; and
determining at least one characteristic representative of the device under test as a function of the sampled magnitude of the standing wave and the plurality of phase shifts.

2. The method of claim 1, wherein the standing wave further comprises a signal transmitted through the device under test.

3. The method of claim 1, wherein sampling the magnitude of the standing wave comprises measuring a voltage of the standing wave at each of the plurality of phase shifts and wherein determining at least one characteristic representative of the device under test comprises measuring a reflection coefficient of the device under test as a function of the measured voltage at each of the plurality of phase shifts.

4. The method of claim 1, wherein the phase shifter is coupled to the transmission line and comprises one or more sub-resonant slots, said slots each having an active element positioned therein, and wherein varying the phase comprises controlling the active element to load the slot in which the active element is positioned for altering the phase of signals on the transmission line.

5. The method of claim 4, wherein the slots have sub-resonant dimensions formed in the wall of a waveguide.

6. A system for analyzing a device under test, the system comprising:
a transmission line for coupling a signal source to the device under test, wherein the signal source provides a signal incident to the device under test at a frequency greater than very high frequency and wherein the signal incident to the device under test and a signal reflected from the device under test form a standing wave on the transmission line;
a phase shifter for varying the phase of the standing wave; and
a detector probe coupled to the transmission line for sampling a magnitude of the standing wave at each of a plurality of phase shift values, wherein at least one characteristic representative of the device under test is determined as a function of the sampled magnitude of the standing wave on the transmission line and the plurality of phase shift values.

7. The system of claim 6, wherein the standing wave comprises the signal incident to the device under test, the signal reflected from the device under test, and a signal transmitted through the device under test.

8. The system of claim 6, further comprising a processor configured for determining the at least one characteristic representative of the device under test.

9. The system of claim 8, wherein the detector probe measures a voltage of the standing wave at each of the plurality of phase shift values and wherein the at least one characteristic determined by the processor comprises a reflection coefficient of the device under test as a function of the measured voltage at each of a plurality of phase shift values.

10. The system of claim 6, wherein the phase shifter is coupled to the transmission line and comprises one or more sub-resonant slots, said slots each having an active element positioned therein, and wherein the phase shifter controls the active element to load the slot in which the active element is positioned for varying the phase of the standing wave.

11. The system of claim 10, wherein the phase shifter comprises a waveguide having the slots formed therein.

12. The system of claim 6, further comprising another detector probe coupled to the transmission line for sampling a magnitude of the standing wave at each of a plurality of phase shifts.

13. A vector network analyzer for determining phase and magnitude of signals at a frequency greater than very high frequency for a device under test (DUT), said vector network analyzer comprising:
- a phase shifter receiving and responsive to a phase control signal for applying a phase shift to a standing wave on a transmission line, said transmission line being coupled to a port of the DUT;
- a transmission line probe coupled to the transmission line for sampling a magnitude of the standing wave on the transmission line at each of a plurality of phase shift values, said probe being configured to generate a detector signal that corresponds to the sampled magnitude of the standing wave; and
- a processor receiving and responsive to the detector signal from the transmission line probe for determining at least one characteristic representative of the DUT as a function of the sampled magnitude of the standing wave on the transmission line, said processor being further configured for generating the phase shifter control signal.

14. The vector network analyzer of claim 13, wherein the transmission line comprises one or more of the following: a waveguide, a coaxial line, and a micro-strip line.

15. The vector network analyzer of claim 13, wherein the transmission line probe comprises at least one active element for producing a signal proportional to the magnitude of the standing wave.

16. The vector network analyzer of claim 15, wherein the active element of the transmission line probe comprises a diode.

17. The vector network analyzer of claim 13, further comprising a signal source for providing a signal incident to the DUT, wherein the signal incident to the DUT and a signal reflected from the DUT form the standing wave on the transmission line, and wherein said signal source is responsive to a source control signal for altering its output.

18. The vector network analyzer of claim 17, wherein the standing wave on the transmission line comprises the signal incident to the DUT, the signal reflected from the DUT, and a signal transmitted through the DUT opposite in direction to the signal incident to the DUT.

19. The vector network analyzer of claim 18, further comprising a directionally isolating element for enabling the signal transmitted through the DUT opposite in direction to the signal incident to the DUT to pass through the DUT.

20. The vector network analyzer of claim 19, wherein the directionally isolating element comprises a switch and a signal isolator.

* * * * *